United States Patent
Lee et al.

(10) Patent No.: US 9,553,087 B1
(45) Date of Patent: Jan. 24, 2017

(54) SEMICONDUCTOR DEVICE

(71) Applicant: TAIWAN SEMICONDUCTOR MANUFACTURING COMPANY LTD., Hsinchu (TW)

(72) Inventors: Jia-Rui Lee, Kaohsiung (TW); Kuo-Ming Wu, Hsinchu (TW); Yi-Chun Lin, Hsinchu (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/930,110

(22) Filed: Nov. 2, 2015

(51) Int. Cl.
| | |
|---|---|
| *H01L 27/088* | (2006.01) |
| *H01L 29/06* | (2006.01) |
| *H01L 29/08* | (2006.01) |
| *H01L 21/8234* | (2006.01) |
| *H01L 21/762* | (2006.01) |

(52) U.S. Cl.
CPC ....... *H01L 27/088* (2013.01); *H01L 21/76224* (2013.01); *H01L 21/823412* (2013.01); *H01L 21/823425* (2013.01); *H01L 21/823481* (2013.01); *H01L 21/823493* (2013.01); *H01L 29/0649* (2013.01); *H01L 29/0847* (2013.01)

(58) Field of Classification Search
CPC ..... H01L 21/823462; H01L 29/0852–29/0886; H01L 29/42364; H01L 29/4238; H01L 29/66681–29/66704;H01L 29/7816–29/7826

See application file for complete search history.

(56) References Cited

U.S. PATENT DOCUMENTS

| | | | |
|---|---|---|---|
| 2004/0183119 A1* | 9/2004 | Negoro | H01L 21/82345 257/314 |
| 2008/0224221 A1* | 9/2008 | Yang | H01L 21/823425 257/365 |
| 2011/0121878 A1 | 5/2011 | Kato et al. | |
| 2013/0140616 A1* | 6/2013 | Schulze | H01L 23/62 257/296 |
| 2015/0061008 A1* | 3/2015 | McGregor | H01L 27/0883 257/337 |
| 2016/0043005 A1* | 2/2016 | You | H01L 21/823814 438/221 |

OTHER PUBLICATIONS

Office Action issued Jun. 17, 2016 for the Germany counterpart application 10 2016 100 019.1.
U. Hilleringmann, Silizium-Halbleitertechnologie, 1. Aufl. (1996), pp. 158-167.

* cited by examiner

*Primary Examiner* — Bryan Junge
(74) *Attorney, Agent, or Firm* — WPAT, P.C., Intellectual Property Attorneys; Anthony King

(57) ABSTRACT

In some embodiments, a semiconductor device includes a first transistor and a second transistor. The first transistor includes a first source region in a first bulk region having a first concentration, and a first gate. The second transistor includes a second source region in a second bulk region having a second concentration higher than the first concentration. The second source region is connected with the first source region and the first gate.

20 Claims, 15 Drawing Sheets

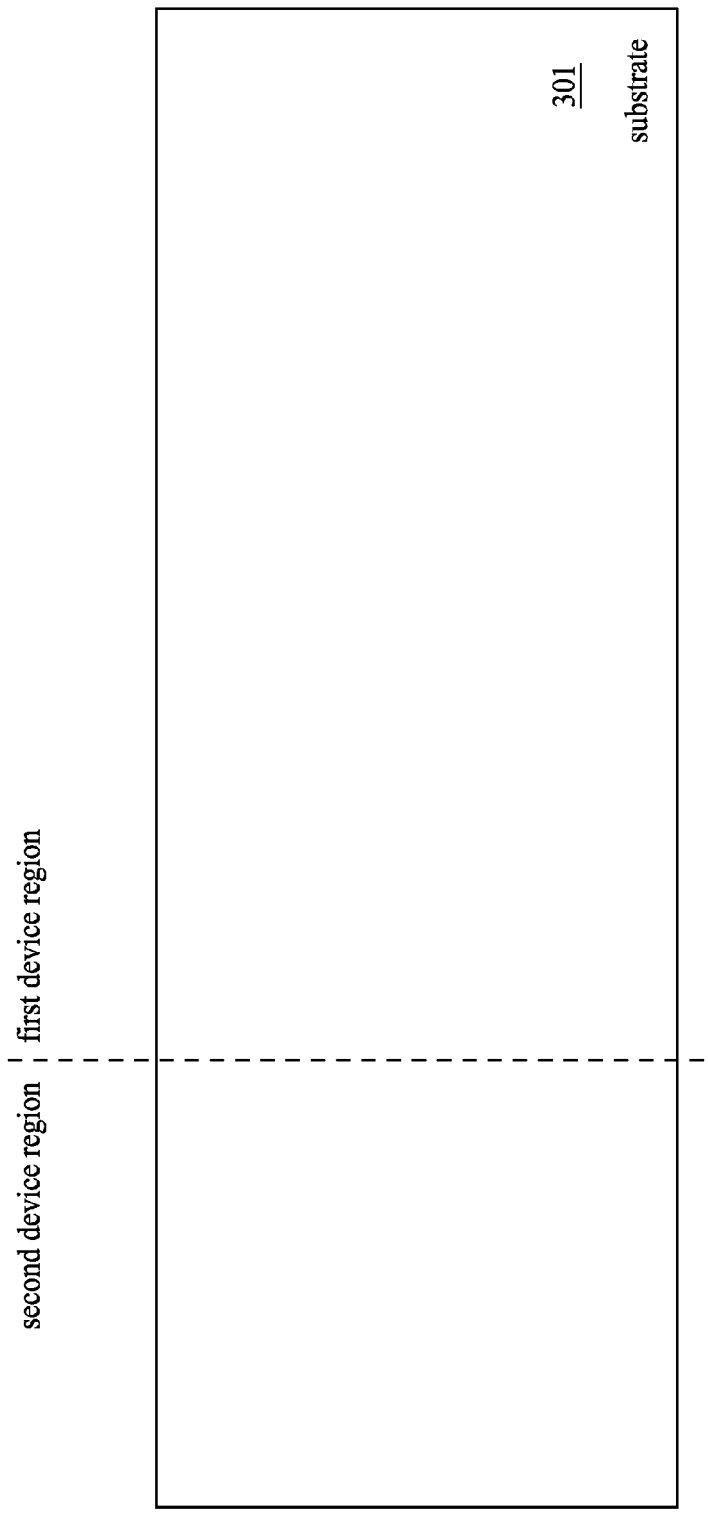

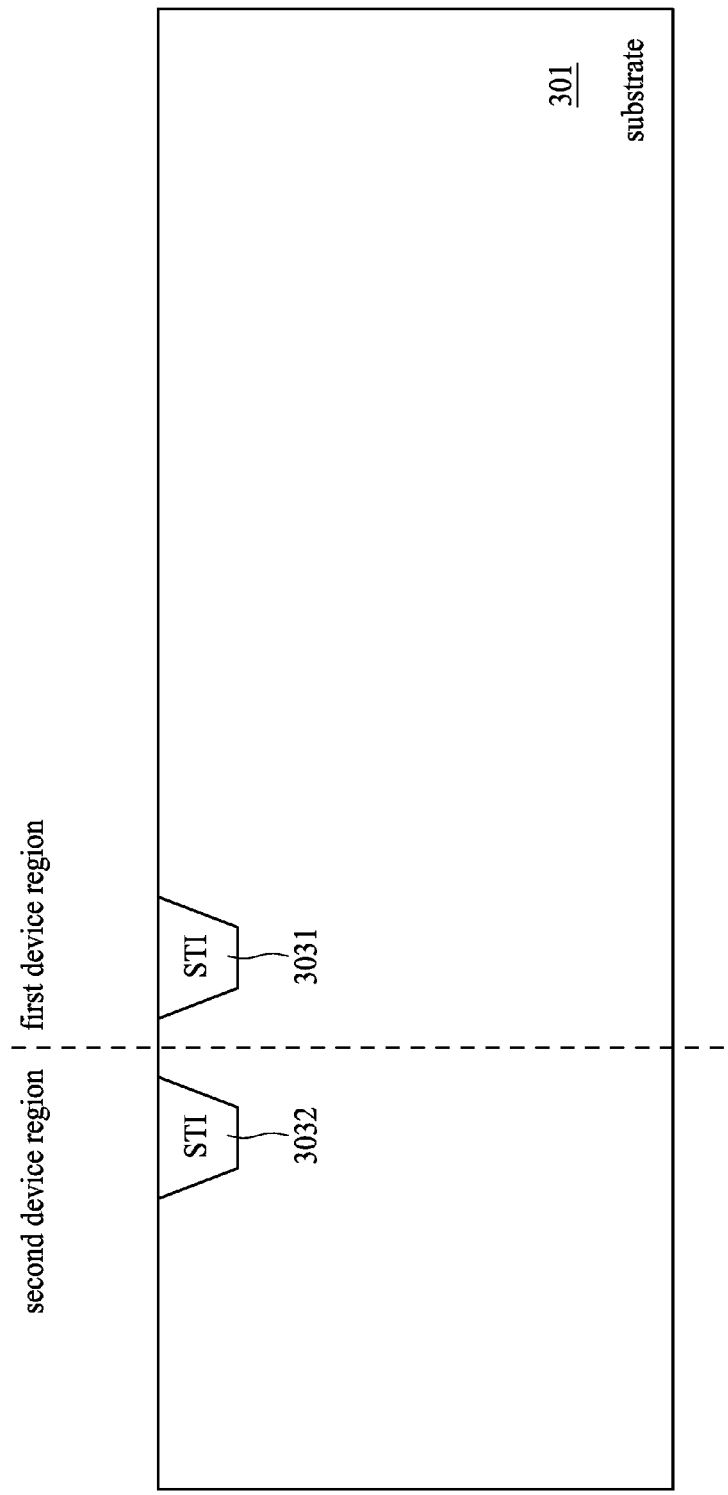

SEMICONDUCTOR DEVICE

BACKGROUND

Nowadays, due to rapid development in microelectronics, it is more complex in designing power systems. There are two main types of regulated power supplies available, a switching mode power supply and a linear power supply. Since the switching mode power supply is more efficient than the linear power supply, the switching power supply has become a popular trend and has been widely used in electronic devices, such as personal computers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3J are diagrams showing a method of manufacturing a semiconductor device, in accordance with some embodiments.

DETAILED DESCRIPTION

Figure 1:
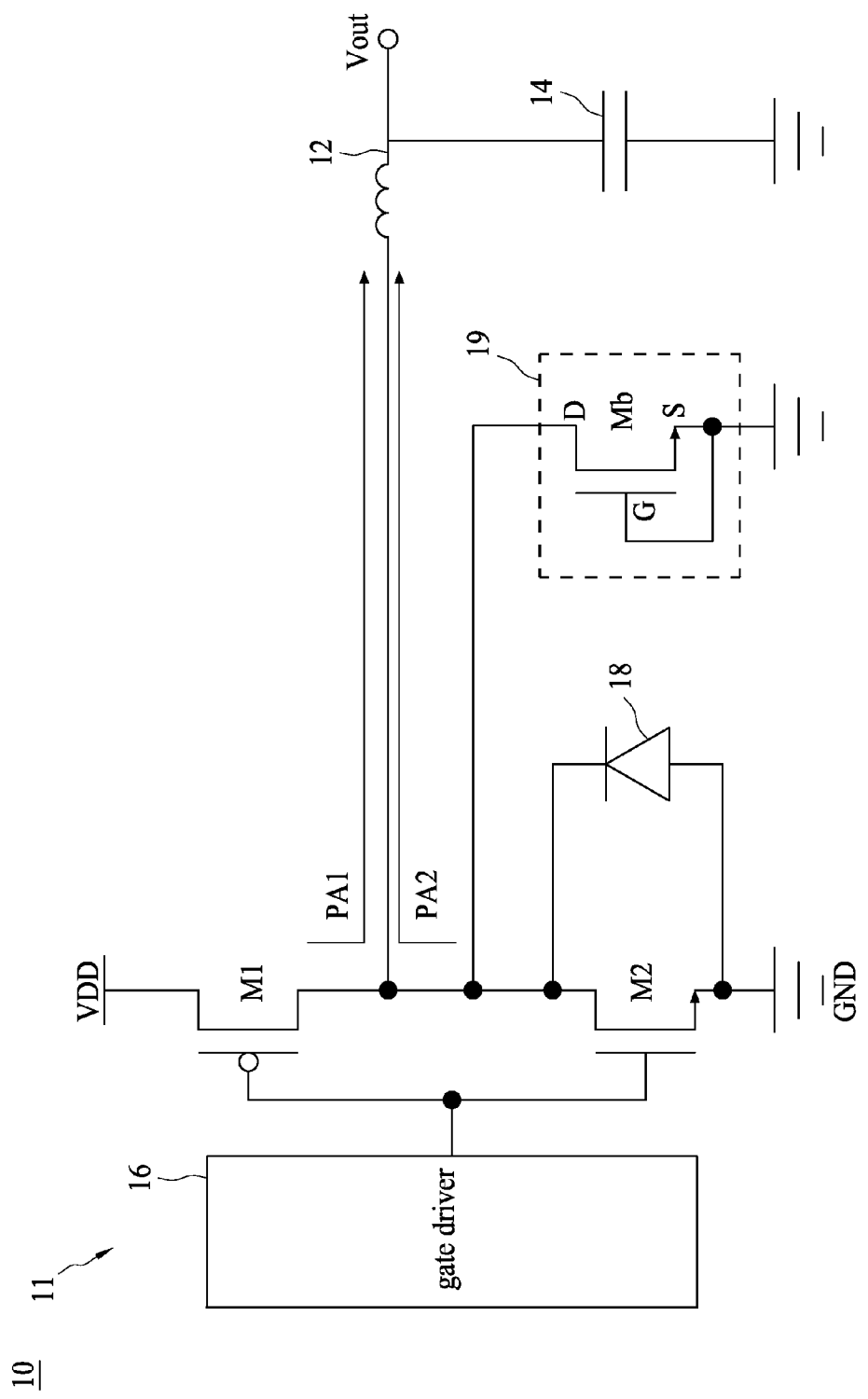
FIG. 1 is a diagram of a circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram of a circuit 10, in accordance with some embodiments. Referring to FIG. 1, the circuit 10 operates in a power domain defined between a power supply VDD and a reference GND, for example, ground level. The circuit 10 includes a power supply circuit 11 and a bypass unit 19. The power supply circuit 11 is configured to convert the power supply VDD to a voltage Vout at an output, and the bypass unit 19 is configured to direct current towards the output, as will be described in detail below.

The power supply circuit 11 includes a first transistor M1, a second transistor M2, an inductor 12, a capacitor 14 and a gate driver 16. The gate driver 16 functions to output a pulse signal to a gate each of the first transistor M1 and the second transistor M2 so as to switch their state of conduction. The voltage level of the voltage Vout may depend on the duty cycle of the pulse signal.

A gate of the first transistor M1 is coupled to the gate driver 16. A source of the first transistor M1 receives the supply voltage VDD. A drain of the first transistor M1 is coupled to one end of the inductor 12. The first transistor M1 in the present embodiment includes a p-type metal-oxide semiconductor (PMOS) transistor.

A gate of the second transistor M2 is coupled to the gate driver 16. A drain of the second transistor M2 is coupled to the drain of the first transistor M1 and also to the one end of the inductor 12. A source of the second transistor M2 is coupled to the reference GND. Moreover, the second transistor M2 includes an intrinsic body diode 18, which is a PN junction diode between a p-type well region and an n-type region. The body diode 18 has an anode coupled to the source of the second transistor M2, and a cathode coupled to the drain of the second transistor M2. In the present embodiment, the second transistor M2 includes an n-type MOS (NMOS) transistor. In some embodiments, the second transistor M2 includes a laterally diffused MOS transistor (LDMOS).

The bypass unit 19, coupled between the drain of the second transistor M2 and the reference GND, is configured to bypass current from the reference GND to the inductor 12 and the capacitor 14. The bypass unit 19 includes a third transistor Mb. A drain D of the third transistor Mb is coupled to the drain of the second transistor M2. A gate G of the third transistor Mb is coupled to the reference GND. A source S of the third transistor Mb is coupled to the reference GND and also to the gate G. As a result, the third transistor Mb is a diode-connected transistor. Since the gate-to-source voltage (VGS) of the third transistor Mb is substantially equal to zero and thus smaller than its threshold voltage, the third transistor Mb is kept at a turned-off (not conducted) state. More specifically, the third transistor Mb operates in a sub-threshold region. In the present embodiment, the third transistor Mb includes an NMOS transistor. In some embodiments, the third transistor M3 includes a laterally diffused MOS transistor (LDMOS).

To prevent a short-circuiting between the power supply VDD and the reference GND, a period of time called "dead time" is introduced such that both the first transistor M1 and the second transistor M2 are maintained at a turned-off state. However, during the dead time a body diode reverse recovery issue may incur, which may adversely affect the voltage Vout. In operation, the first transistor M1 is turned on while the second transistor M2 is turned off in response to a pulse signal from the gate driver 16. Current from the power supply VDD flows via the source to the drain of first transistor M1 towards the output along a first path PA1, charging the inductor 12 and the capacitor 14. Subsequently, the gate driver 16 inverts the state of conduction of the first transistor M1 and the second transistor M2. Before completely inverting the state of conduction of the first transistor M1 and the second transistor M2, the first transistor M1 and the second transistor M2 are turned off in the dead time. Current from the reference GND charges the inductor 12 and the capacitor 14 along a second path PA2. In some existing approaches free from a bypass mechanism, the charging current would flow through the body diode 18, and the undesired body diode reverse recovery is incurred.

To alleviate the body diode reverse recovery, the bypass unit 19 is connected in parallel with the body diode 18 in order to bypass the current from the reference GND. The bypass unit 19 has a threshold voltage smaller than that of the body diode 18. For example, the threshold voltage of the bypass unit 19 is approximately 0.3 volt (V), and the threshold voltage of the body diode 18 is approximately 0.7V. Accordingly, the bypass unit 19 is conducted before the body diode 18 is conducted. With the bypass unit 19, a significant portion of the current from the reference GND flows towards the output via the inductor 12 and the capacitor 14 during the dead time, thereby reducing current flowing through the body diode 18. In this way, the body diode reverse recovery issue is alleviated. Effectively, substantially all of the current from the reference GND flows through the bypass unit 19 and bypasses the body diode 18, so that the body diode reverse recovery issue is eliminated.

The bypass unit 19 is implemented with a transistor, and thus has a relatively low area cost. In some existing approaches, an off-chip bypass device or a Schottky diode is used to address the issue of body diode reverse recovery. Such approaches may suffer a relatively high area cost.

The bypass unit 19 has a breakdown voltage, such as 12V, 16V or 20V, depending on the semiconductor structure of the bypass unit 19, which will be described in detail with reference to FIG. 2. Moreover, the area of the bypass unit 19 decreases as the breakdown voltage of the bypass unit 19 decreases. Since the desired breakdown voltage and hence the area of the bypass unit 19 can be predetermined, the bypass unit 19 provides flexibility in circuit design.

For example, if in an application the circuit 10 is desired to operate under a relatively high power supply VDD, such as 20V, a designer determines that the breakdown voltage of the bypass unit 19 is 20V, according to the voltage level of the power supply VDD, i.e., 20V. In operation, when the first transistor M1 is turned on and the second transistor M2 is turned off, the voltage level at the drain of the second transistor M2 is approximately 20V. If the breakdown voltage of the bypass unit 19 were 5V, the bypass unit 19 would be unable to endure the voltage difference, 20V, across the bypass unit 19 and breakdown of the bypass unit 19 would occur. If breakdown of the bypass unit 19 occurs, the circuit 10 may not function correctly.

On the other hand, if in another application the circuit 10 is desired to operate under a relatively low power supply VDD, such as 5V, the designer determines that the breakdown voltage of the bypass unit 19 is 5V, according to the power supply VDD of 5V. Since the area of the bypass unit 19 decreases as the breakdown voltage of the bypass unit 19 decreases, the bypass unit 19 for the 5V application may be designed with a smaller area than the bypass unit 19 for the 20V application. As a result, the breakdown voltage and the area of the bypass unit 19 can be optimized, depending on the application.

In some existing approaches using a Schottky diode as a bypass device, the breakdown voltage of the Schottky diode is determined by the materials of the Schottky diode, which may include metal and silicon. The breakdown voltage of the Schottky diode cannot be changed without changing the material. However, changing the material make the semiconductor manufacturing process complex. As a result, the breakdown voltage of the Schottky diode is not flexible and the area of the Schottky diode cannot be optimized for different applications.

Figure 2:
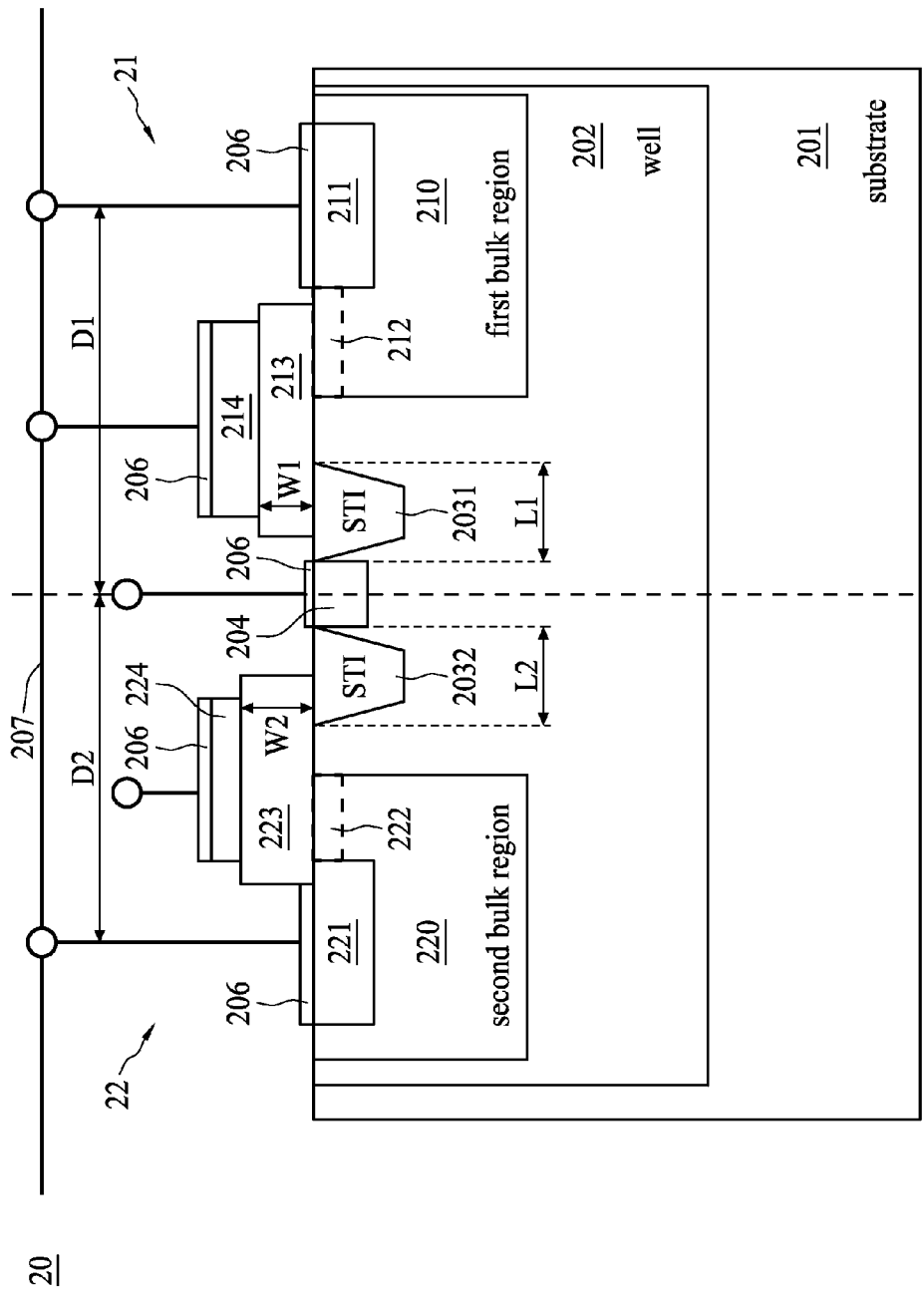
FIG. 2 is a cross-sectional view of a semiconductor device, in accordance with some embodiments.

FIG. 2 is a cross-sectional view of a semiconductor device 20, in accordance with some embodiments. Referring to FIG. 2, the semiconductor device 20 includes a first transistor 21 and a second transistor 22. Moreover, the third transistor Mb described and illustrated with reference to FIG. 1 is implemented with the first transistor 21, and the second transistor M2 described and illustrated with reference to FIG. 1 is implemented with the second transistor 22. For convenience, in FIG. 2 only the second transistor 22 (corresponding to the second transistor M2 in FIG. 1) and the associated first transistor 21 (corresponding to the third transistor Mb in FIG. 1 that serves as a bypass unit for the second transistor M2) are shown, and the first transistor M1 in FIG. 1 is not illustrated.

The first transistor 21 includes a first insulating layer 213 on a substrate 201, a first poly layer 214 on the first insulating layer 213, and a first source region 211, a first drain region and a first channel 212 in the substrate 201. The first source region 211 is formed in a first bulk region 210 in a well 202 of the substrate 201. The first drain region is defined by the well 202 and a doped region 204 disposed between shallow trench isolations (STIs) 2031 and 2032 in the well 202. The first channel 212 is defined in the first bulk region 210 between the first source region 211 and the first STI 2031, and underlies the first insulating layer 213. The first bulk region 210 overlaps a portion of the first poly layer 214. In some embodiments, the substrate 201 includes a p-type substrate, and the well 202 includes a high voltage n-well (HVNW). Moreover, each of the doped region 204 and the first source region 211 includes an n-type dopant, while the first bulk region 210 includes a p-type dopant. As a result, with the first poly layer 214 serving as a first gate, the first transistor 21 includes an NMOS transistor structure.

In some embodiments, the first insulating layer 213 includes an oxide layer. The first insulating layer 213 has a first thickness W1, which ranges from about 25 angstroms to about 60 angstroms. The first thickness W1 is a factor that determines the threshold voltage of the first transistor 21.

The first bulk region 210 serves as a body for the first transistor 21. Moreover, the first bulk region 210 has a first concentration, which ranges from about $5*10^{15}$ to $1*10^{16}$ $cm^{-3}$. The first concentration is also a factor that determines the threshold voltage of the first transistor 21.

The first STI 2031 between the first bulk region 210 and the doped region 204 has a first length L1 in a direction where the first channel 212 extends. In some embodiments, the center-to-center distance D1 between the first source region 211 and the doped region 204 increases as the first length L1 increases, and vice versa. Moreover, the first length L1 and the associated distance D1 are factors that determine the breakdown voltage of the first transistor 21.

Similarly, the second transistor 22 includes a second insulating layer 223 on the substrate 201, a second poly layer 224 on the second insulating layer 223, and a second source region 221, a second drain region and a second channel 222 in the substrate 201. The second source region 221 is formed in a second bulk region 220 in the well 202 of the substrate 201. Like the first drain region, the second drain region is also defined by the well 202 and the doped region 204 disposed between STIs 2031 and 2032 in the well 202. The doped region 204 functions to serve as a drain of the first transistor 21 and the second transistor 22. The second channel 222 is defined in the second bulk region 220 between the second source region 221 and the second STI 2032, and underlies the second insulating layer 223. The second bulk region 220 overlaps a portion of the second poly layer 224. As previously discussed, the substrate 201 includes a p-type substrate, and the well 202 includes a high voltage n-well (HVNW). In addition, each of the doped region 204 and the second source region 221 includes an n-type dopant, while the second bulk region 220 includes a p-type dopant. As a result, with the second poly layer 224 serving as a second gate, the second transistor 22 includes an NMOS transistor structure.

In some embodiments, the second insulating layer 223 includes an oxide layer. The second insulating layer 223 has a second thickness W2, which ranges from about 100 angstroms to about 350 angstroms. The second thickness W2 is a factor that determines the threshold voltage of the second transistor 22.

The second bulk region 220 serves as a body for the second transistor 22. Moreover, the second bulk region 220 has a second concentration, which ranges from about $1.5*10^{16}$ to $2*10^{17}$ cm$^{-3}$. The second concentration is also a factor that determines the threshold voltage of the second transistor 22.

The second STI 2032 between the second bulk region 220 and the doped region 204 has a second length L2 in a direction where the second channel 222 extends. In some embodiments, the center-to-center distance D2 between the second source region 221 and the doped region 204 increases as the second length L2 increases, and vice versa. Moreover, the second length L2 and the associated distance D2 are factors that determine the breakdown voltage of the second transistor 22.

In order to alleviate the body diode reverse recovery issue, the second transistor 22 is designed with a greater threshold voltage than the first transistor 21. In an embodiment, the second concentration is higher than the first concentration, so that the second transistor 22 has a threshold voltage greater than that of the first transistor 21. In another embodiment, the second thickness W2 is greater than the first thickness W1, resulting in a greater threshold voltage. In still another embodiment, the second thickness W2 is greater than the first thickness W1, and the second concentration is greater than the first concentration. In yet another embodiment, the second thickness W2 is greater than the first thickness W1, while the second concentration is equal to the first concentration. In yet still another embodiment, the second concentration is higher than the first concentration, while the second thickness W2 is equal to the first thickness W1. Effectively, the body diode reverse recovery issue is alleviated or even eliminated without sacrificing the area cost that would otherwise be required in Schottky diodes.

Moreover, as mentioned above, a designer is able to determine a desired breakdown voltage of each of the first transistor 21 and the second transistor 22 in accordance with the power supply VDD. Since the breakdown voltage of the first transistor 21 is associated with the first length L1 (or the distance D1) and the breakdown voltage of the second transistor 22 is associated with the second length L2 (or the distance D2), by adjusting the first length L1 or the second length L2 or both, the designer can design the semiconductor device 20 before manufacturing it. In this way, the area consumed by the first transistor 21 and the second transistor 22 is optimized.

Conductive components 206 are formed on the first source region 211, the second source region 221, the first poly layer 214, the second poly layer 224 and the doped region 204 to serve as pick-ups for electrical connection. Moreover, also referring to the transistors Mb and M2 in FIG. 1, the first source region 211, the first poly layer 214 and the second source region 221 are electrically connected to an interconnect 207.

Figure 3C:
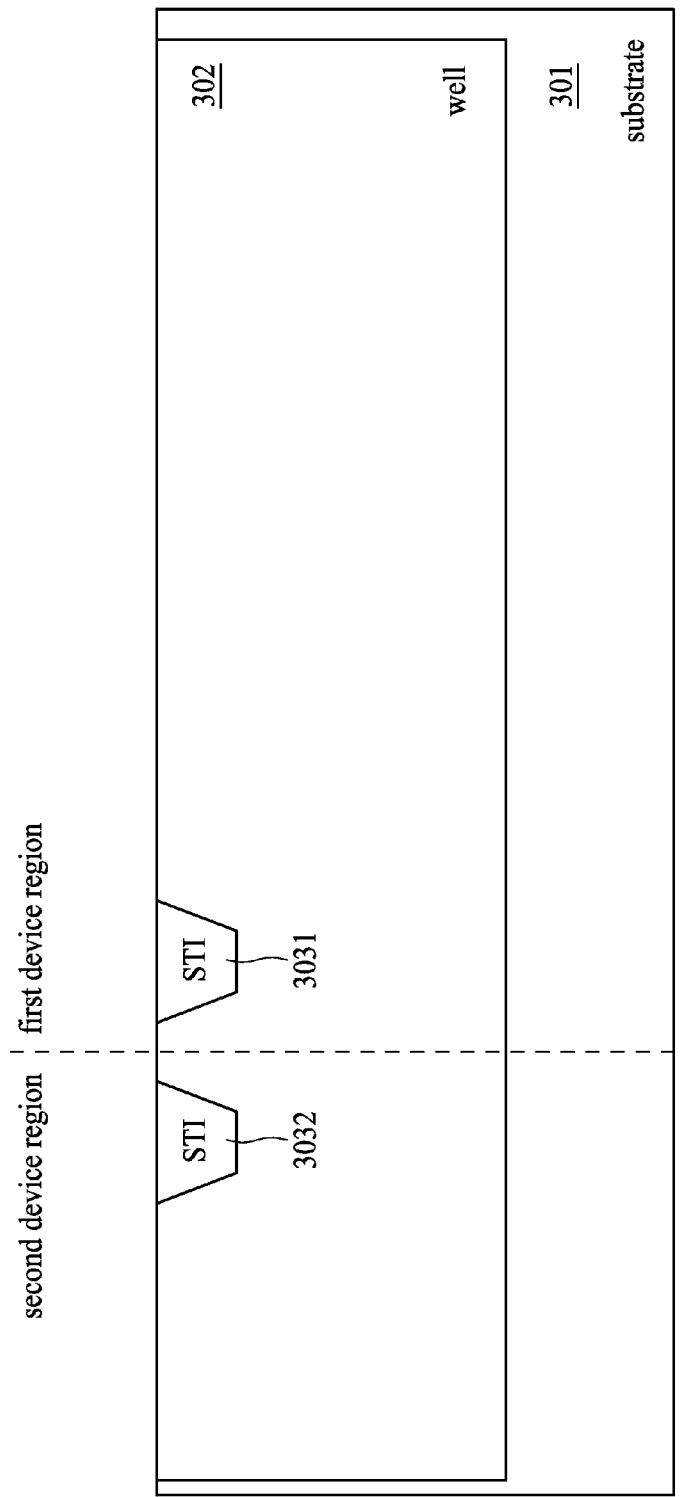

FIGS. 3A to 3J are diagrams showing a method of manufacturing a semiconductor device, in accordance with some embodiments. Referring to FIG. 3A, a substrate 301 is provided. The substrate 301 includes a first device region and a second device region, where a first transistor and a second transistor are to be formed, respectively. The first device region and the second device region are associated with the first transistor and the second transistor, respectively. In some embodiments, the substrate 301 includes a p-type substrate.

Referring to FIG. 3B, a first STI 3031 and a second STI 3032 are formed in the substrate 301 by, for example, a deposition process, an etching process, a pullback process, an annealing process and a chemical mechanical planarization process sequentially performed in order. The STIs 3031 and 3032 are disposed in the first device region and the second device region, respectively.

Referring to FIG. 3C, a well 302 is formed in the substrate 301 by, for example, an ion implantation process followed by a drive-in process. In some embodiments, the well 302 includes a high voltage n-well (HVNW).

Figure 3D:
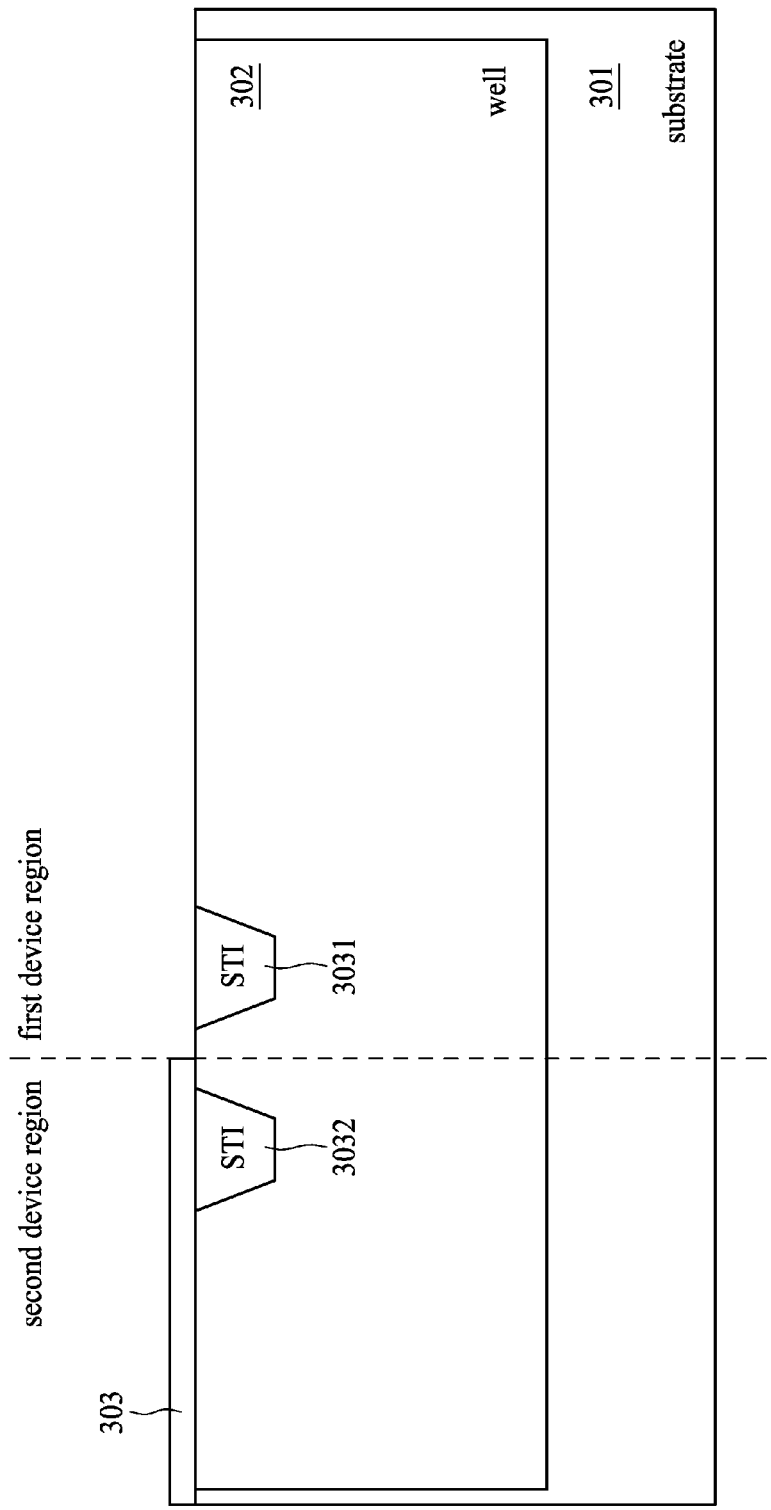

Referring to FIG. 3D, a patterned insulating layer 303 is formed on the substrate 301 by a deposition process followed by an etching process, exposing the well 302 in the first device region. In some embodiments, the patterned insulating layer 303 includes an oxide layer.

Figure 3E:
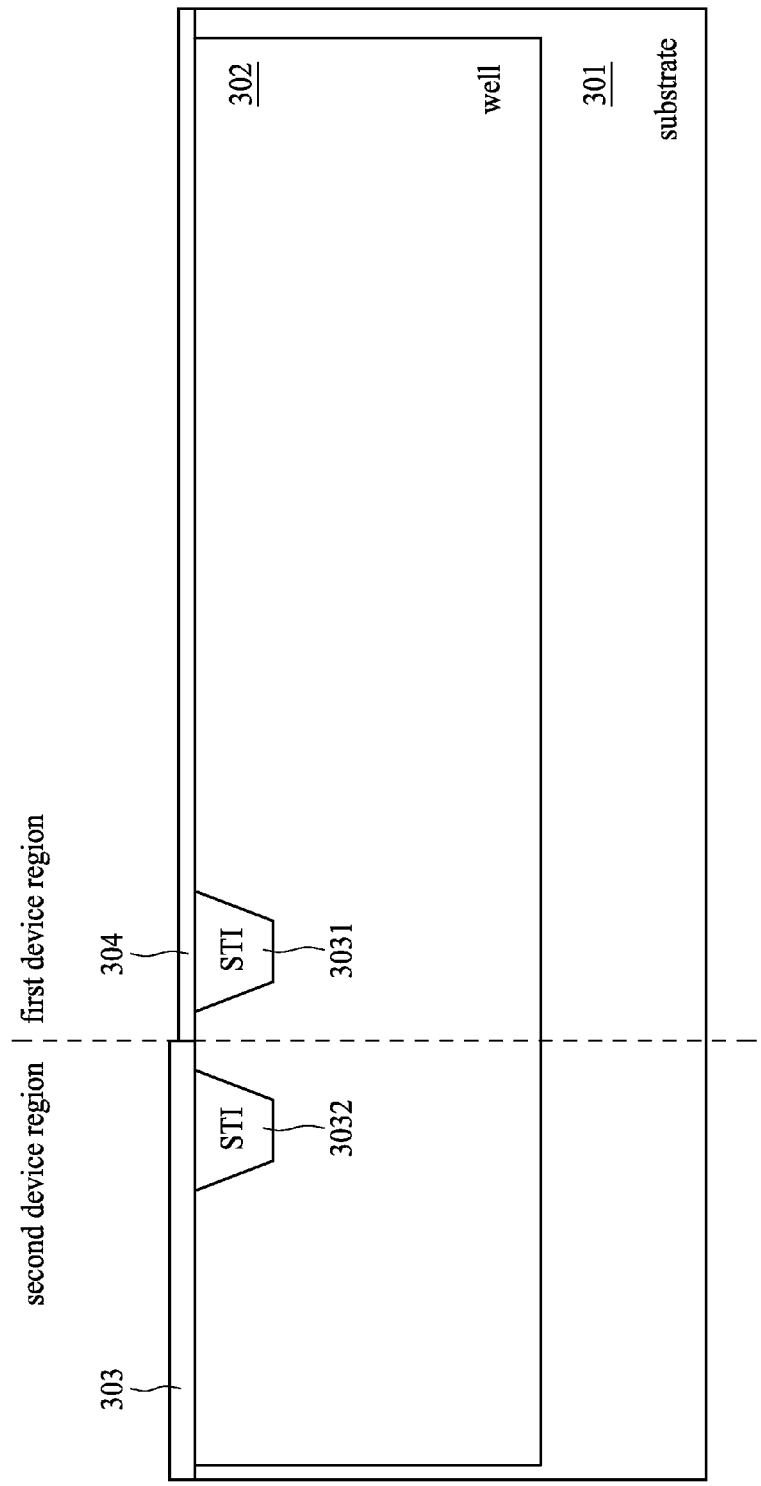

Referring to FIG. 3E, a patterned insulating layer 304 is formed on the substrate 301 in the first device region by, for example, a deposition process. In some embodiments, the patterned insulating layer 304 includes an oxide layer. As previously discussed and as shown in the present embodiment, as an approach to alleviate the body diode reverse recovery issue, the thickness of the patterned insulating layer 303 is greater than that of the patterned insulating layer 304. In other embodiments, the processes of forming insulating layers of different thickness in FIGS. 3D and 3E are replaced by forming a single insulating layer on the substrate 301 by, for example, a deposition process. In that case, the insulating layer has a uniform thickness in the first device region and the second device region. To alleviate the body diode reverse recovery issue, bulk regions to be subsequently formed in the first and second device regions are doped at different concentrations.

Figure 3F:
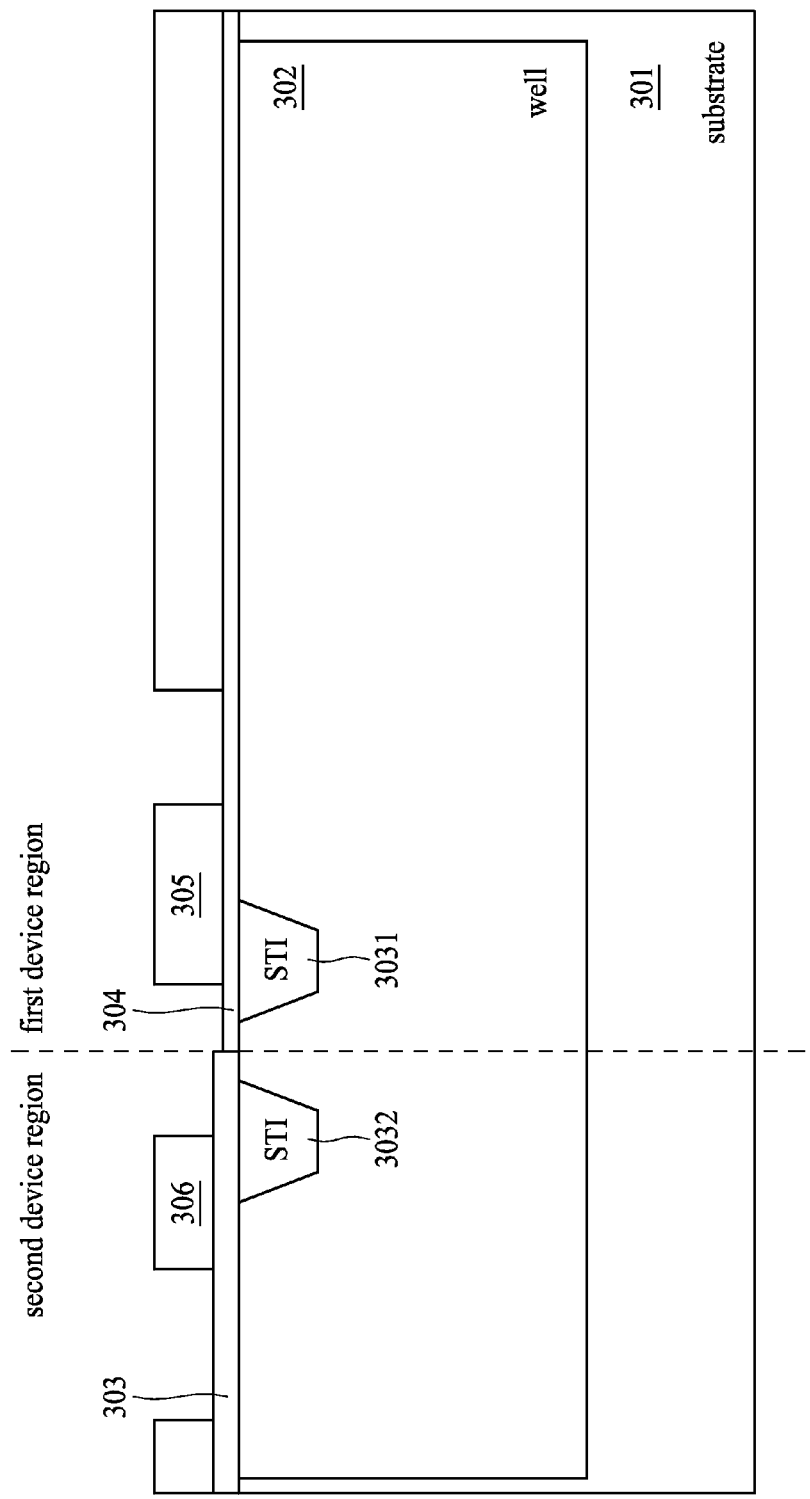

Referring to FIG. 3F, a patterned poly layer is formed on the insulating layers 303 and 304 by, for example, a deposition process followed by an etching process, resulting in a first poly layer 305 in the first device region and a second poly layer 306 in the second device region. The first poly layer 305 overlaps a portion of the first STI 3031 and functions to serve as a first gate of the first transistor. The second poly layer 306, separated from the first poly layer 305, overlaps a portion of the second STI 3032 and functions to serve as a second gate of the second transistor.

Figure 3G:
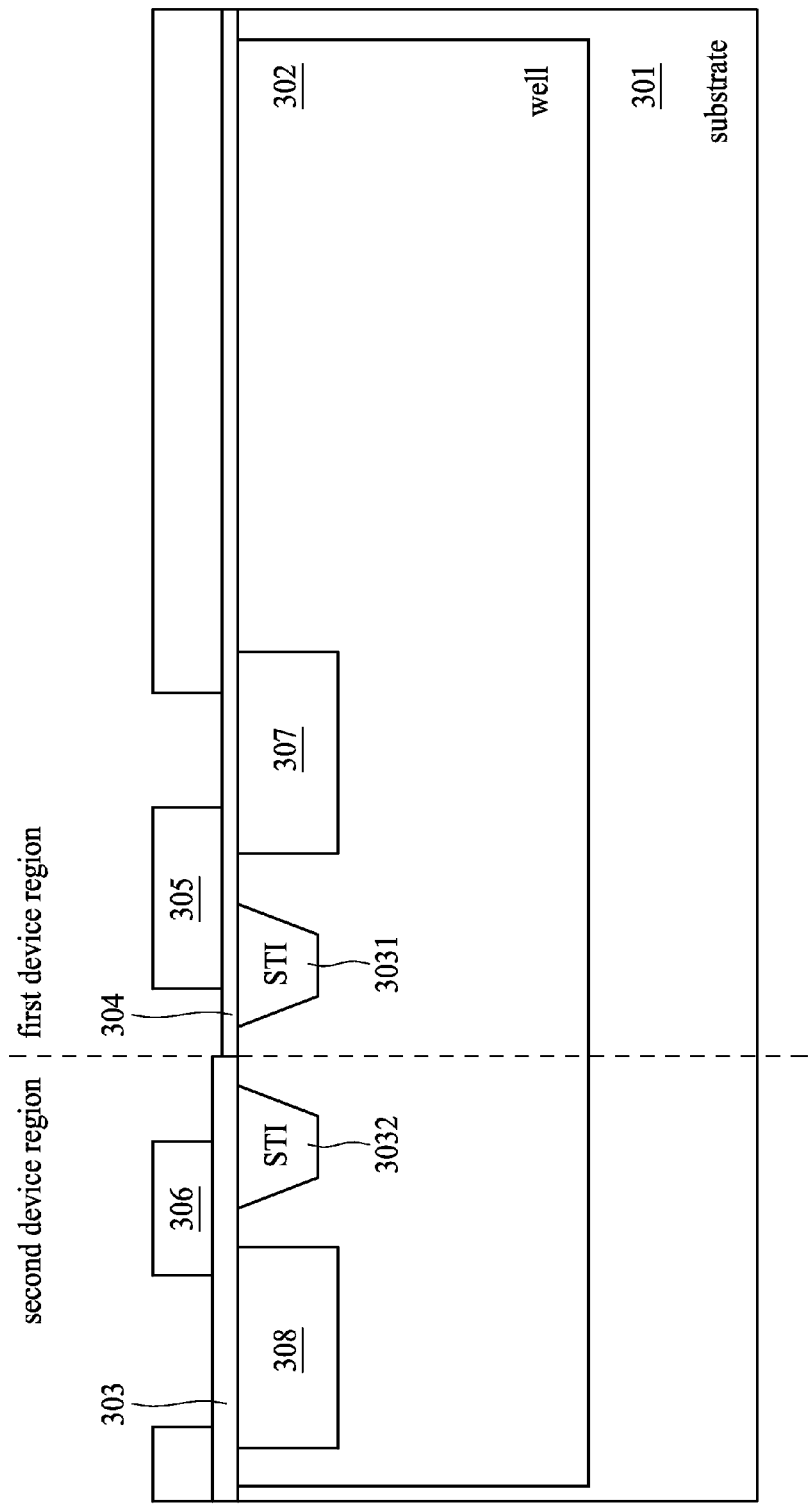

Referring to FIG. 3G, a first bulk region 307 is defined in the well 302 in the first device region and a second bulk region 308 is defined in the well 302 in the second device region by, for example, an ion implantation process. As previously discussed, as another approach to alleviate the body diode reverse recovery issue, the concentration of the second bulk region 308 is greater than that of the first bulk region 307. Specifically, the first bulk region 307 in the well 302 in the first device region and the second bulk region 308 in the well 302 in the second device region are formed by doping a dopant of a dopant type a first predetermined times in the well 302 so as to define the first bulk region 307, and doping a dopant of the dopant type a second predetermined times in the well 302 so as to define the second bulk region 308. The second predetermined times is greater than the first predetermined times.

Alternatively, the first bulk region 307 in the well 302 in the first device region and the second bulk region 308 in the well 302 in the second device region are formed by doping a dopant of a first dopant type having a first concentration and a dopant of a second dopant type, opposite to the first dopant type, having a second concentration smaller than the first concentration in the first bulk region 307, and doping a dopant of the first dopant type in the second bulk region 308. Since a portion of the dopant of the first dopant type is balanced off by the dopant of the second dopant type in the first bulk region 307, only the dopant of the first dopant type remains in the first bulk region 307. As a result, the concentration of the dopant of the first dopant type in the first bulk region 307 is smaller than the concentration of the dopant of the second dopant type in the second bulk region 308. In this way, the second concentration is greater than the first concentration.

Figure 3H:
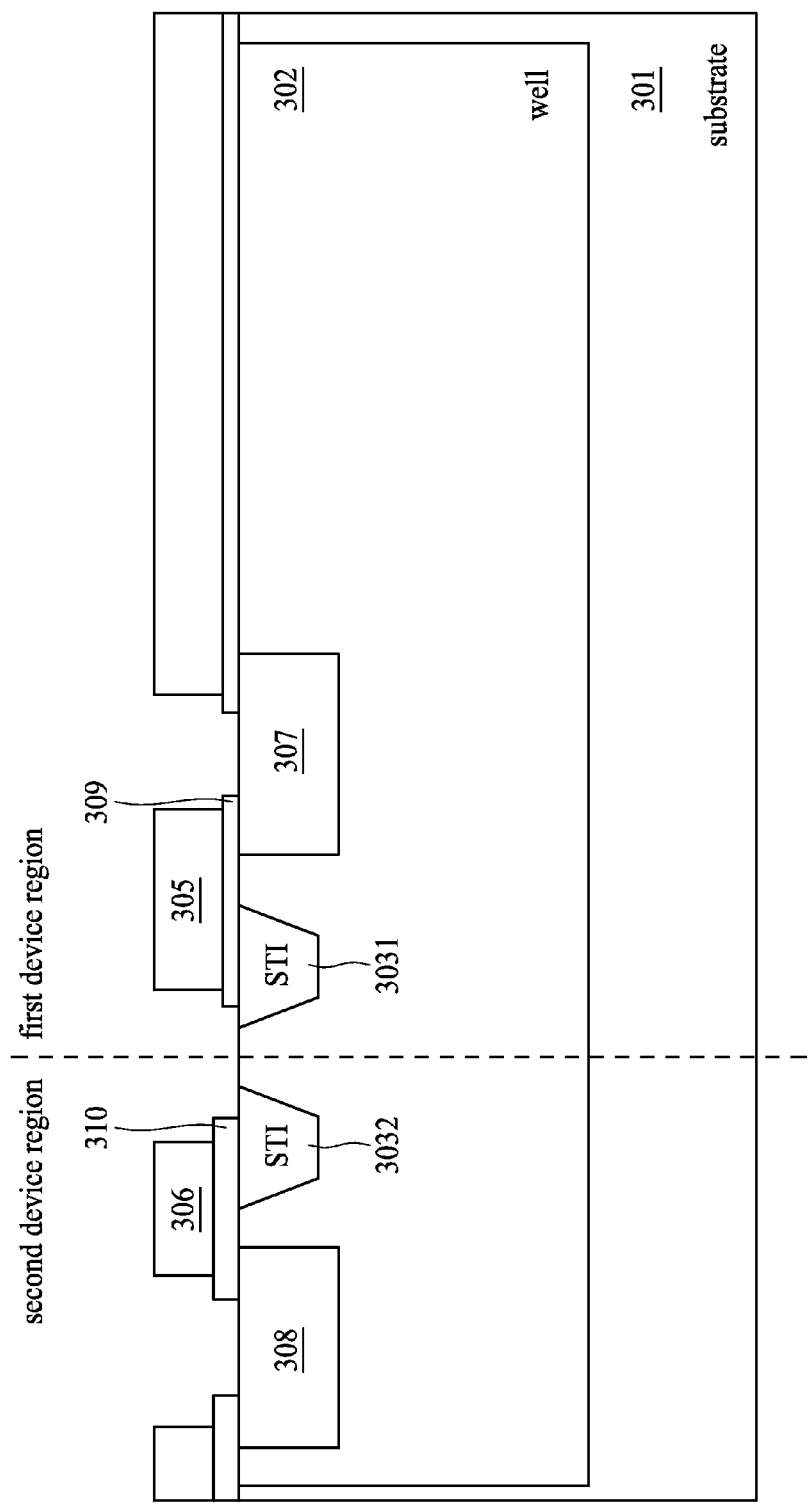

Referring to FIG. 3H, a first insulating layer 309 and a second insulating layer 310 are formed on the substrate 301 by, for example, an etching process, exposing a portion of the first bulk region 307, a portion of the second bulk region 308 and a border between the first device region and a second device region. The first insulating layer 309 and the second insulating layer 310 function to serve as gate oxides of the first transistor and the second transistor, respectively.

Figure 3I:
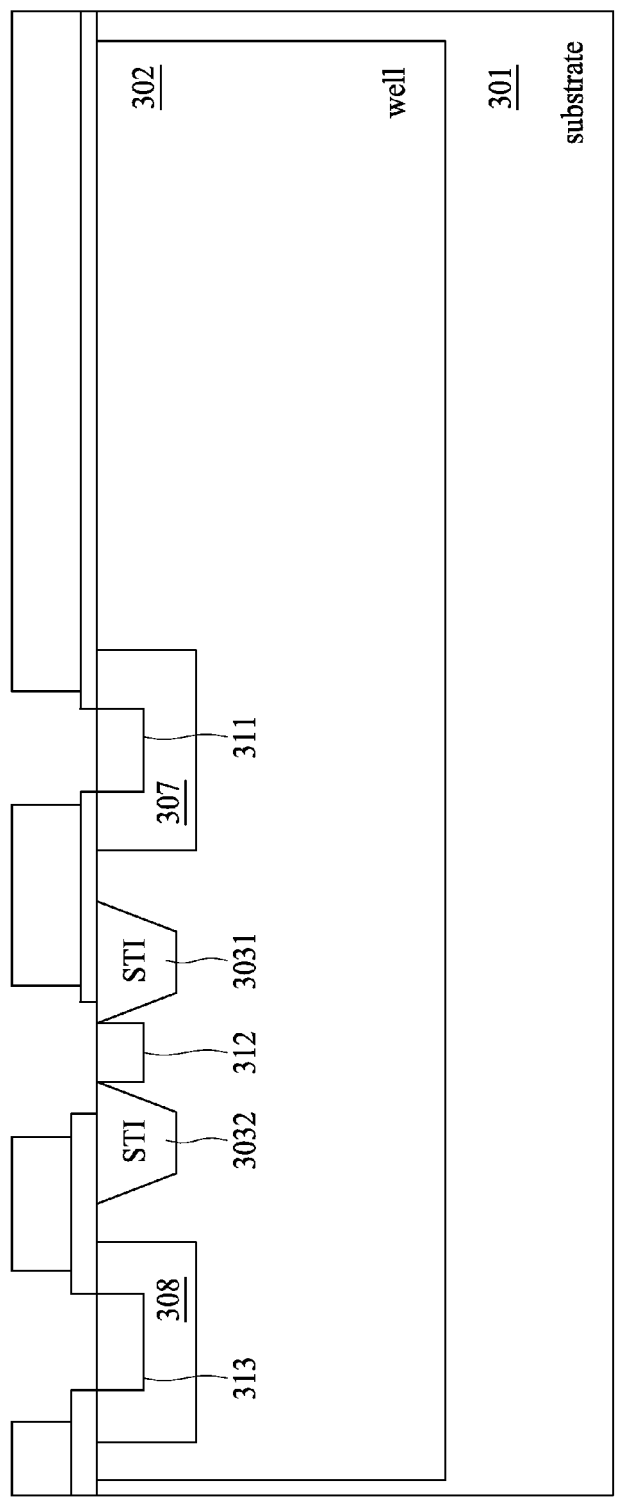

Referring to FIG. 3I, a first source region 311 is defined in the first bulk region 307, a doped region 312 is defined in the well 302 between the STIs 3031 and 3032, and a second source region 313 is defined in the second bulk region 308 by, for example, an ion implantation process.

Figure 3J:
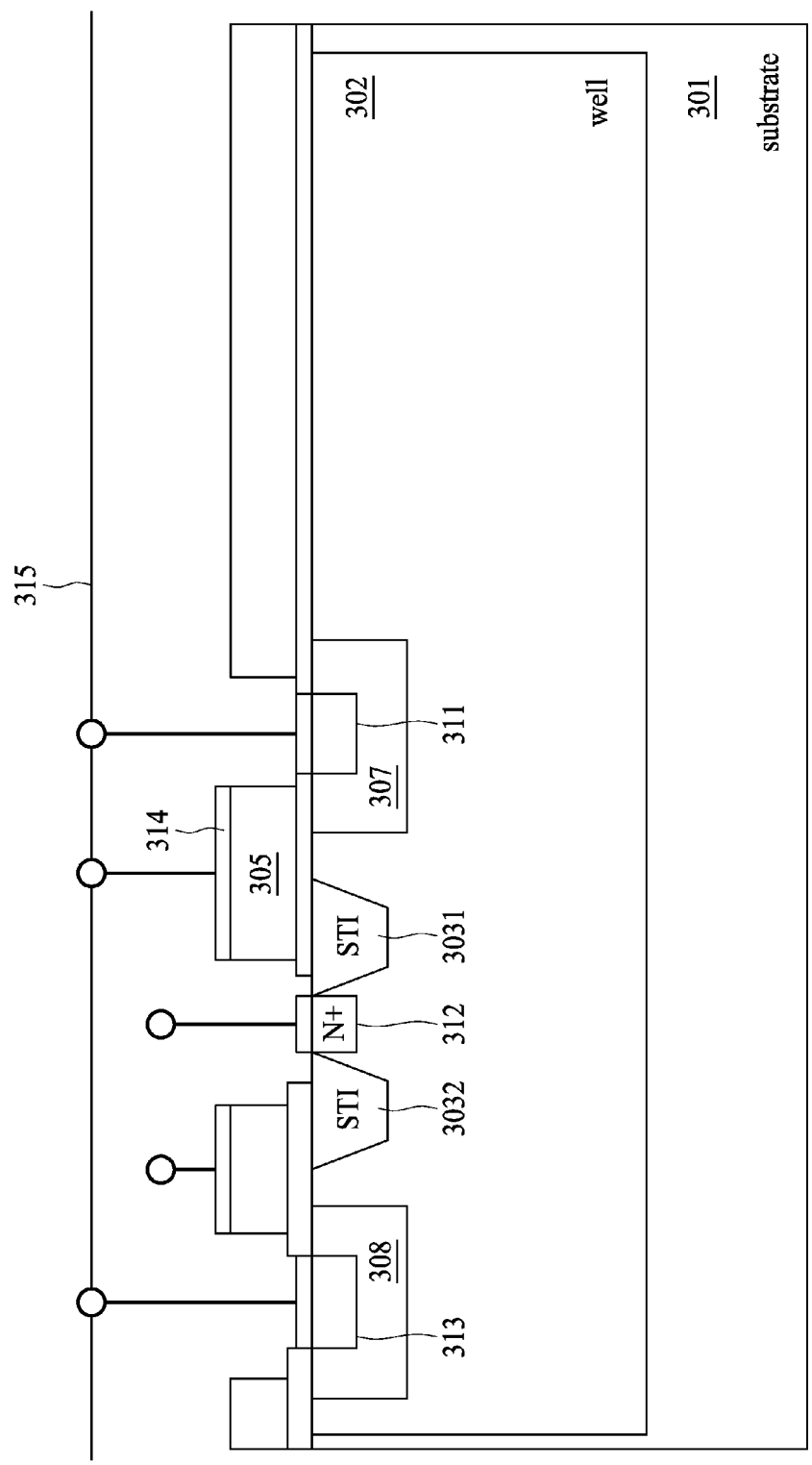

Referring to FIG. 3J, conductive components 314 are formed on the first source region 311, the doped region 312, the second source region 313, the first poly layer 305 and the second poly layer 306 by, for example, a deposition process followed by an etching process. The conductive components 314 serve as pick-up regions for electrical connection to an interconnect 315. Moreover, the first source region 311, the first poly layer 305 and the second source region 313 are connected together to the interconnect 315.

Figure 4A:
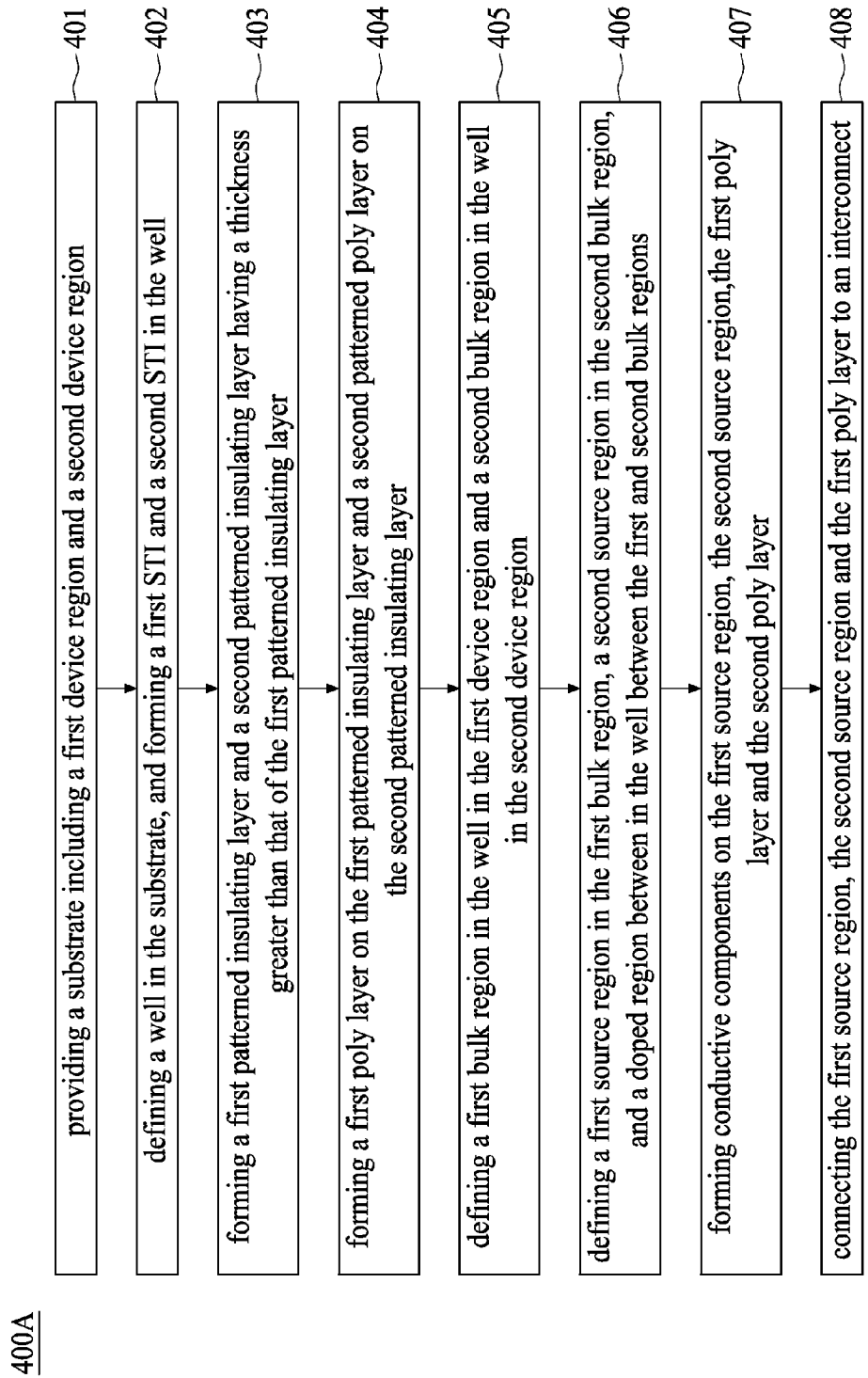
FIG. 4A is a flow diagram illustrating a method of forming a semiconductor device, in accordance with some embodiments.

FIG. 4A is a flow diagram illustrating a method 400A of forming a semiconductor device, in accordance with some embodiments. Referring to FIG. 4A, in operation 401, a substrate is provided. The substrate includes a first device region and a second device region, wherein a first transistor and a second transistor are to be formed, respectively. The substrate is similar to the substrate 201 or the substrate 301 described and illustrated with reference to FIGS. 2 and 3A, respectively.

In operation 402, a well is defined in the substrate. The well is similar to well 202 or the well 302 described and illustrated with reference to FIGS. 2 and 3C, respectively. In an embodiment, the well includes an HVNW. Subsequently, a first STI and a second STI are formed in the well in the first device region and the second device region, respectively.

In operation 403, a first patterned insulating layer and a second patterned insulating layer are formed on the substrate in the first device region and the second device region, respectively. The second patterned insulating layer has a thickness greater than that of the first patterned insulating layer. The first patterned insulating layer is similar to the patterned insulating layer 304 described and illustrated with reference to FIG. 3E, and the second patterned insulating layer is similar to the patterned insulating layer 303 described and illustrated with reference to FIG. 3D. In an embodiment, the first patterned insulating layer includes an oxide layer for a core device, and the second patterned insulating layer includes an oxide layer for an I/O device.

In operation 404, a first poly layer is formed on the first patterned insulating layer and a second patterned poly layer is formed on the second patterned insulating layer. The first poly layer serves as a first gate of the first transistor, and the second poly layer serves as a second gate of the second transistor.

In operation 405, a first bulk region is defined in the well in the first device region and a second bulk region is defined in the well in the second device region. The first bulk region serves as a body for the first transistor, and the second bulk region serves as a body for the second transistor. In some embodiments, the second bulk region has a concentration greater than that of the first bulk region. In some embodiments, the second bulk region has a concentration equal to that of the first bulk region. The first bulk region and the second bulk region are similar to the first bulk region 307 and the second bulk region 308, respectively, described and illustrated with reference to FIG. 3G.

In operation 406, a first source region, a doped region, and a second source region are defined in the first bulk region, the well and the second bulk region, respectively. A first drain region of the first transistor is defined by the well and the doped region, and the second drain region of the second transistor is also defined by the well and the doped region.

In operation 407, conductive components are formed on the first source region, the second source region, the doped region, the first poly layer and the second poly layer. The conductive components serve as pick-up regions for electrical connection to an interconnect.

In operation 408, the first source region, the first poly layer and the second source region are connected together to the interconnect.

Figure 4B:
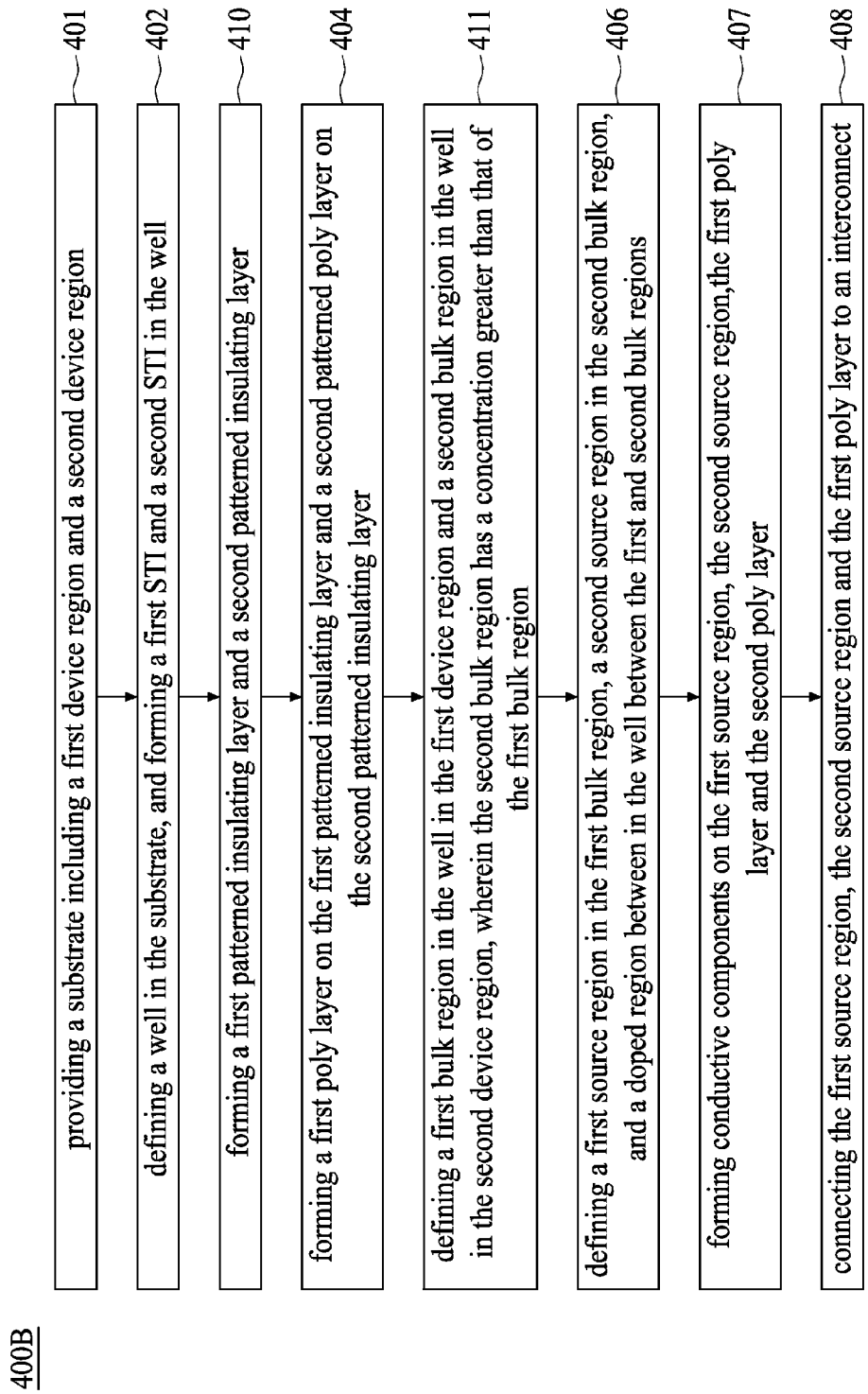
FIG. 4B is a flow diagram illustrating another method of forming a semiconductor device, in accordance with some embodiments.

FIG. 4B is a flow diagram illustrating another method 400B of forming a semiconductor device, in accordance with some embodiments. Referring to FIG. 4B, the method 400B shown in FIG. 4B is similar to the method 400A shown in FIG. 4A except that, for example, operation 410 replaces operation 403, and operation 411 replaces operation 405. In operation 410, a first patterned insulating layer and a second patterned insulating layer are formed on the substrate in the first device region and the second device region, respectively. In some embodiments, the second patterned insulating layer has a thickness greater than that of the first patterned insulating layer. In other embodiments, the second patterned insulating layer has a thickness equal to that of the first patterned insulating layer.

In operation 411, a first bulk region is defined in the well in the first device region and a second bulk region is defined in the well in the second device region. The second bulk region has a concentration greater than that of the first bulk region.

Figure 5:
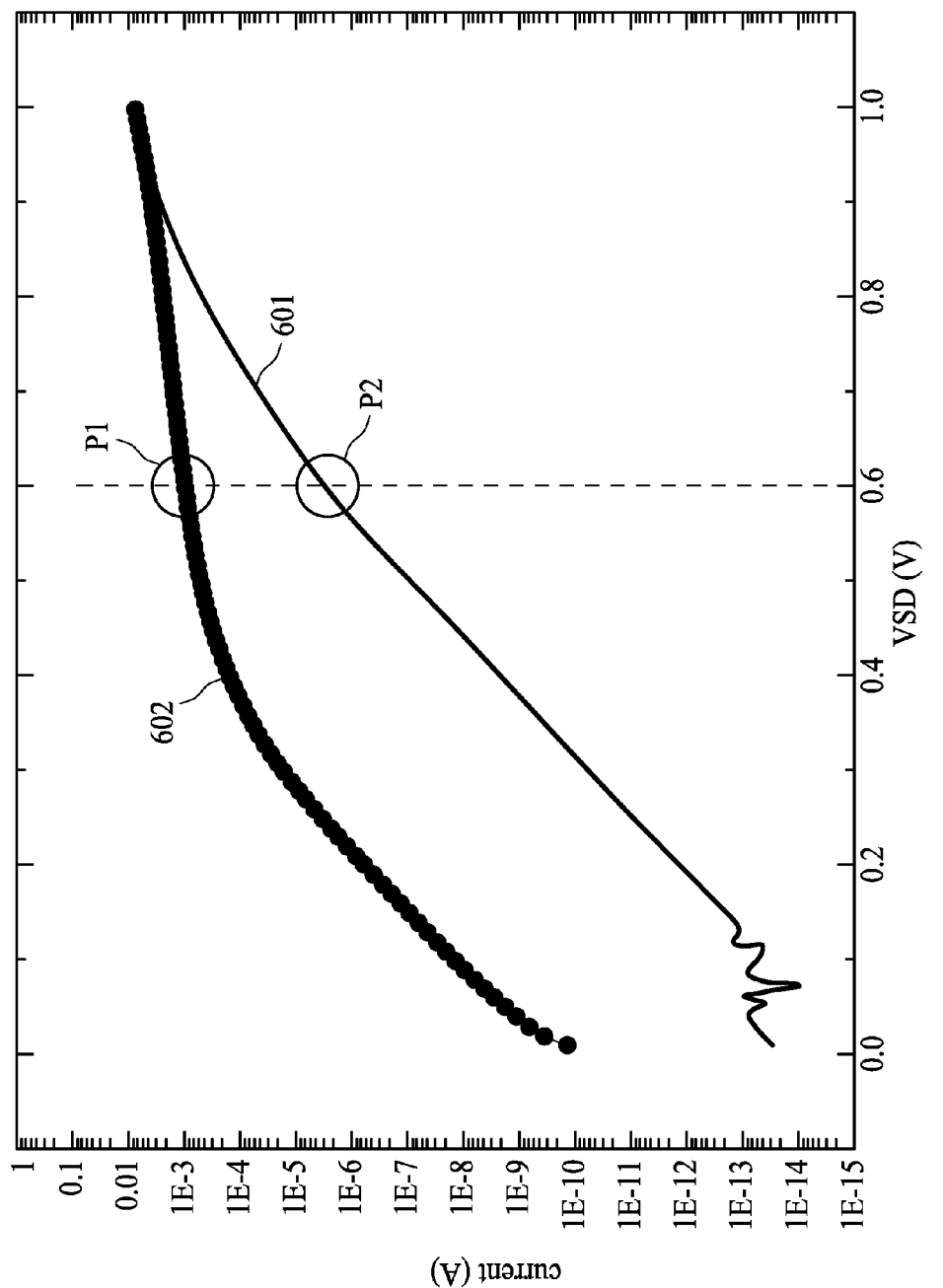
FIG. 5 is a schematic diagram showing simulation results of a circuit with and without the bypass unit illustrated in FIG. 1.

FIG. 5 is a schematic diagram showing simulation results of a circuit with and without the third transistor Mb as a bypass unit. Referring to FIG. 5, the horizontal axis represents a source-to-drain voltage (VSD) of the second transistor M2, and the vertical axis represents magnitude of current in microampere ($\mu$A). Curve 601 represents a reverse current flowing through the body diode 18 when a circuit is free from the third transistor Mb. Curve 602 represents a reverse current flowing through the third transistor Mb when a circuit is provided with the third transistor Mb.

Typically, the total amount of the reverse current is a sum of the reverse current flowing through the body diode 18 and the reverse current flowing through the third transistor Mb. Accordingly, the amount of the reverse current flowing through the body diode 18 decreases as the amount of the reverse current flowing through the third transistor Mb increases. For example, assume the total amount of the reverse current is 1 ampere (A). When the reverse current flowing through the third transistor Mb is 0.6 milliampere (mA), the reverse current flowing through the body diode 18 is 0.4 mA. Moreover, when the reverse current flowing through the third transistor Mb increases to 0.8 mA, the reverse current flowing through the body diode 18 decreases to 0.2 mA. As a result, when the amount of the reverse current flowing through the body diode 18 decreases, the body diode reverse recovery issue is alleviated. Effectively, substantially all of the reverse current flows through the third transistor Mb and bypasses the body diode 18, so that the body diode reverse recovery issue is eliminated.

As shown in FIG. 5, the magnitude of the reverse current flowing through the third transistor Mb as indicated in curve 602 is obviously greater than the magnitude of the reverse current flowing through the body diode 18 as indicated in curve 601. In particular, at VSD of about 0.6V, which is a turned-on voltage of the body diode 18, the magnitude of the reverse current flowing through the third transistor Mb at point P1 is about 1000 times the magnitude of the reverse current flowing through the body diode 18. That is, only a few reverse current flowing through the body diode 18. Therefore, the body diode reverse recovery issue is significantly alleviated.

Some embodiments have one or a combination of the following features and/or advantages. In some embodiments, a semiconductor device includes a first transistor and a second transistor. The first transistor includes a first source region in a first bulk region having a first concentration, and a first gate. The second transistor includes a second source region in a second bulk region having a second concentration higher than the first concentration. The second source region is connected with the first source region and the first gate.

In some embodiments, a semiconductor device includes a first transistor and a second transistor. The first transistor includes a first source region in a first bulk region, a first insulating layer having a first thickness and a first gate on the first insulating layer. The second transistor includes a second source region in a second bulk region, a second insulating layer having a second thickness greater than the first thickness and a second gate on the second insulating layer. The second source region is connected with the first source region and the first gate region.

In some embodiments, a method of forming a semiconductor device includes: providing a substrate including a first device region and a second device region associated with a first transistor and a second transistor, respectively; forming a well in the substrate; forming a first patterned insulating layer in the first device region, the first patterned insulating layer having a first thickness; forming a second patterned insulating layer in the second device region, the second patterned insulating layer having a second thickness greater than the first thickness; forming a first gate on the first patterned insulating layer; forming a first bulk region and a second bulk region in the well in the first device region and the second device region, respectively; forming a first source region and a second source region in the first bulk region and the second bulk region, respectively; and connecting the first source region, the first gate and the second source region together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor including:
   a first source region in a first bulk region having a first dopant concentration; and a first gate; and
   a second transistor including:
   a second source region in a second bulk region having a second dopant concentration higher than the first dopant concentration, the second source region electrically connected with the first source region and the first gate region.

2. The semiconductor device as claimed in claim 1, wherein the first transistor includes a first insulating layer having a first thickness, and the second transistor includes a second insulating layer having a second thickness, the second thickness being greater than the first thickness.

3. The semiconductor device as claimed in claim 1, wherein the first transistor includes a first insulating layer having a first thickness, and the second transistor includes a second insulating layer having a second thickness, the second thickness being equal to the first thickness.

4. The semiconductor device as claimed in claim 1, further comprising a first shallow trench isolation (STI) and a second STI, and a doped region between the first and second STIs.

5. The semiconductor device as claimed in claim 4, wherein the doped region functions to serve as a drain of the first transistor and the second transistor.

6. The semiconductor device as claimed in claim 1, wherein the first dopant concentration ranges from about $5*10^{15}$ to $1*10^{16}$ cm$^{-3}$, and the second dopant concentration ranges from about $1.5*10^{16}$ to $2*10^{17}$ cm$^{-3}$.

7. The semiconductor device as claimed in claim 1, wherein the first bulk region overlaps a portion of the first gate and the second bulk region overlaps a portion of the second gate, further comprising:
   a first channel defined in the first bulk region and a second channel defined in the second bulk region.

8. A semiconductor device, comprising:
   a first transistor including:
   a first source region in a first bulk region;
   a first insulating layer having a first thickness; and
   a first gate on the first insulating layer; and
   a second transistor including:
   a second source region in a second bulk region, the second source region electrically connected with the first source region and the first gate;
   a second insulating layer having a second thickness, the second thickness being greater than the first thickness; and
   a second gate on the second insulating layer.

9. The semiconductor device as claimed in claim 8, wherein the first bulk region has a first dopant concentration, and the second bulk region has a second dopant concentration higher than the first dopant concentration.

10. The semiconductor device as claimed in claim 8, wherein the first bulk region has a first dopant concentration, and the second bulk region has a second dopant concentration equal to the first dopant concentration.

11. The semiconductor device as claimed in claim 8, further comprising a first shallow trench isolation (STI) and a second STI, and a doped region between the first and second STIs.

12. The semiconductor device as claimed in claim 11, wherein the doped region functions to serve as a drain of the first transistor and the second transistor.

13. The semiconductor device as claimed in claim 8, wherein the first thickness ranges from about 25 angstroms to about 60 angstroms, and the second thickness ranges from 100 angstroms to about 350 angstroms.

14. The semiconductor device as claimed in claim 8, wherein the first bulk region overlaps a portion of the first gate and the second bulk region overlaps a portion of the second gate, further comprising:
- a first channel defined in the first bulk region and a second channel defined in the second bulk region.

15. A method of forming a semiconductor device, the method comprising:
- providing a substrate including a first device region and a second device region associated with a first transistor and a second transistor, respectively;
- forming a well in the substrate;
- forming a first patterned insulating layer in the first device region, the first patterned insulating layer having a first thickness;
- forming a second patterned insulating layer in the second device region, the second patterned insulating layer having a second thickness greater than the first thickness;
- forming a first gate on the first patterned insulating layer;
- forming a first bulk region and a second bulk region in the well in the first device region and the second device region, respectively;
- forming a first source region and a second source region in the first bulk region and the second bulk region, respectively; and
- electrically connecting the first source region, the first gate and the second source region together.

16. The method as claimed in claim 15, further comprising:
- forming a first shallow trench isolation (STI) and a second STI in the substrate; and
- forming a doped region in the well between the first and second STIs.

17. The method as claimed in claim 16, wherein the doped region functions to serve as a drain of the first transistor and the second transistor.

18. The method as claimed in claim 15, wherein the first bulk region has a first dopant concentration and the second bulk region has a second dopant concentration higher than the first dopant concentration.

19. The method as claimed in claim 15, wherein the first bulk region has a first dopant concentration and the second bulk region has a second dopant concentration equal to the first dopant concentration.

20. The method as claimed in claim 15, wherein the first bulk region overlaps a portion of the first patterned insulating layer and the second bulk region overlaps a portion of the second patterned insulating layer.

* * * * *